(12) United States Patent
Chen et al.

(10) Patent No.: US 7,445,972 B2
(45) Date of Patent: Nov. 4, 2008

(54) FABRICATION PROCESS OF MEMORY CELL

(75) Inventors: Hung-Tse Chen, Hsinchu County (TW); Chi-Lin Chen, Hsinchu County (TW); Yu-Cheng Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/963,854

(22) Filed: Dec. 24, 2007

(65) Prior Publication Data
US 2008/0108195 A1 May 8, 2008

Related U.S. Application Data

(62) Division of application No. 11/308,710, filed on Apr. 25, 2006, now Pat. No. 7,339,190.

(30) Foreign Application Priority Data
Nov. 3, 2005 (TW) .............................. 94138538 A

(51) Int. Cl.
*H01L 21/00* (2006.01)
(52) U.S. Cl. ......................................... 438/149; 257/66

(58) Field of Classification Search .............. 257/E27.1, 257/E27.112, E29.117, E29.202, E21.005, 257/E21.121, E29.151; 438/149, 150, 151, 438/152, 153, 154, 155, 157, 164
See application file for complete search history.

(56) References Cited

U.S. PATENT DOCUMENTS 6,991,974 B2 * 1/2006 Tsao ........................ 438/151

* cited by examiner

*Primary Examiner*—David Vu
(74) *Attorney, Agent, or Firm*—Jianq Chyun IP Office

(57) ABSTRACT

A memory cell suitable for being disposed over a substrate is provided. The memory cell includes a poly-silicon island, a first dielectric layer, a trapping layer, a second dielectric layer and a control gate. The poly-silicon island is disposed on the substrate and includes a source region, a drain region and a channel region located between the source and drain regions. The channel region has a plurality of regularly arranged tips thereon. The first dielectric layer is disposed on the poly-silicon island. The trapping layer is disposed on the first dielectric layer. The second dielectric layer is disposed on the trapping layer. The control gate is disposed on the second dielectric layer. The memory cell mentioned above can be integrated into the LTPS-LCD panel or OLED panel.

7 Claims, 19 Drawing Sheets

US 7,445,972 B2

FABRICATION PROCESS OF MEMORY CELL

CROSS-REFERENCE TO RELATED APPLICATION

This application is a divisional of an application Ser. No. 11/308,710, filed on Apr. 25, 2006, now U.S. Pat. No. 7,339,190, which claims the priority benefit of Taiwan application serial no. 94138538, filed on Nov. 3, 2005. The entirety of each of the above-mentioned patent applications is hereby incorporated by reference herein and made a part of this specification.

BACKGROUND OF THE INVENTION

1. Field of Invention

The present invention relates to a memory cell and fabrication process thereof, and more particularly to a memory cell suitable for fabricating a Metal-Oxide-Nitride-Oxide-Poly-Silicon (MONOS) on a substrate.

2. Description of Related Art

Since the liquid crystal display (LCD) and the organic light-emitting diode (OLED) display have the advantages of being light, thin, short, and small, they have gradually become the display for the portable terminal system. Especially, the twisted nematic liquid crystal display (TN-LCD), super twisted nematic liquid crystal display (STN-LCD), and thin film transistor liquid crystal display (TFT-LCD) have become the indispensable display products. The TFT-LCD pixel mainly includes a thin film transistor, a storage capacitor, and a pixel electrode. The image data written in each pixel is stored in the storage capacitor and is updated frame by frame. Therefore, the power consumption of the TFT-LCD having this architecture is quite high.

As for most of the current portable electronic devices, the LCD is used to display static images for most of the time, so it is unnecessary to keep updating the image data stored in the pixel. In this case, if a memory, such as SRAM or DRAM, is embedded in each pixel, the power consumption of the LCD can be greatly reduced.

FIG. 1 is a circuit diagram of a conventional pixel structure. Referring to FIG. 1, a conventional pixel structure 100 for displaying a static picture includes a thin film transistor 110, a liquid crystal capacitor 120, a memory control circuit 130, and a SRAM 140. The gate G of the thin film transistor 110 is electrically connected to the scan line SL. The source S of the thin film transistor 110 is electrically connected to the data line DL. The drain D of the thin film transistor 110 is electrically connected to the liquid crystal capacitor 120. In addition, the drain D of the thin film transistor 110 can be electrically connected to the SRAM 140 through the memory control circuit 130, such that the image signal input to the liquid crystal capacitor 120 from the data line DL can be stored in the SRAM 140 through the memory control circuit 130.

In the circumstance of displaying static images, the SRAM 140 can keep a voltage difference between two electrodes of the liquid crystal capacitor 120 without updating the data continuously, and thus the power consumption can be significantly reduced. However, the SRAM 140 is composed of at least four thin film transistors T1, and the memory control circuit 130 is composed of at least two thin film transistors T2. The thin film transistors T1, T2 make the circuit layout of the pixel structure 100 quite crowded, and adversely affects the aperture ratio of the pixel structure 100. Therefore, the pixel structure 100 can only be used in the reflective LCD panel instead of the transmissive LCD panel.

SUMMARY OF THE INVENTION

Accordingly, the present invention is directed to provide a memory cell suitable for being integrated into a low temperature poly-silicon thin film transistor (LTPS-TFT).

The present invention is directed to provide a pixel structure that consumes less power compared to the conventional pixel described above.

The present invention is directed to provide a fabrication process of a memory cell that can be integrated into a LTPS-TFT fabrication process.

As embodied and broadly described herein, the present invention provides a memory cell is provided, which is suitable for being disposed on a substrate. The memory cell comprises a poly-silicon island, a first dielectric layer, a trapping layer, a second dielectric layer, and a control gate. The poly-silicon island is disposed on the substrate and includes a source region, a drain region and a channel region located between the source and drain regions, wherein the channel region comprises a plurality of regularly arranged tips on its surface. The first dielectric layer is disposed on the poly-silicon island. The trapping layer is disposed on the first dielectric layer. The second dielectric layer is disposed on the trapping layer. And, the control gate is disposed on the second dielectric layer.

As embodied and broadly described herein, the present invention provides a pixel structure suitable for being electrically connected to a scan line and a data line is provided. The pixel structure includes an active device, a pixel electrode, a control circuit, and one or more memory cells described above (such as, single memory cell or a memory cell array). The pixel electrode is electrically connected to the scan line and the data line through the active device. The memory cell is electrically connected between the control circuit and the pixel electrode. The active device can be, for example, a thin film transistor. The control circuit can be composed of, for example, one or more thin film transistors.

In an embodiment of the present invention, the material of the first dielectric layer comprises silicon dioxide. The material of the trapping layer comprises silicon nitride. The material of the second dielectric layer comprises silicon dioxide.

In an embodiment of the present invention, the control gate is disposed over the channel region. In another embodiment of the present invention, the control gate is disposed over the channel region, a part of the source region and a part of the drain region.

In an embodiment of the present invention, the poly-silicon island further includes a charge induced doped region located between the channel region and the drain region and below the control gate. In addition, the width of the charge induced doped region is smaller than or equal to that of the channel region. The source region and the drain region is a N-type doped region, and the charge induced doped region is, for example, a P-type doped region.

In an embodiment of the present invention, the memory cell may further include a buffer layer sandwiched between the substrate and the poly-silicon island.

In an embodiment of the present invention, the memory cell further includes a source contact metal and a drain contact metal, wherein the source contact metal is electrically connected to the source region, and the drain contact metal is electrically connected to the drain region.

In an embodiment of the present invention, the tips of the channel region mentioned above are arranged in a row parallel to the extending direction of the control gate.

In an embodiment of the present invention, the tips of the channel region mentioned above include plurality of first tips arranged in a row parallel to the extending direction of the control gate, and a plurality of second tips arranged in a row parallel to the extending direction of the control gate, wherein the first tips are closer to the source region, and the second tips are closer to the drain region.

As embodied and broadly described herein, the present invention provides a method for fabricating a memory cell is provided. First, a poly-silicon island is formed on a substrate including a source region, a drain region, and a channel region located between the source and drain regions. The channel region comprises a plurality of regularly arranged tips on its surface. Next, a first dielectric layer, a trapping layer, and a second dielectric layer are sequentially formed on the poly-silicon island. Finally, a control gate is formed on the second dielectric layer.

In an embodiment of the present invention, the step of forming the poly-silicon island includes the following steps. First, an amorphous silicon layer is formed on a substrate. Next, the amorphous silicon layer is re-crystallized into a poly-silicon layer with a plurality of regularly arranged tips by using the sequential laterally solidified low temperature poly-silicon technology (SLS-LTPS technology). Finally, the poly-silicon layer is patterned and doped to form a source region, a drain region and a channel region in the poly-silicon layer. The method for forming the source region and the drain region comprises, for example, an ion implantation method using N-type dopants.

In an embodiment of the present invention, a charge induced doped region is further formed between the channel region and the drain region, wherein the charge induced doped region is located below the control gate.

In an embodiment of the present invention, the step of forming a charge induced doped region comprises, for example, implanting P-type dopants into the poly-silicon layer.

In an embodiment of the present invention, a buffer layer is further formed between the substrate and the poly-silicon island.

In an embodiment of the present invention, a source contact metal and a drain contact metal are further formed, wherein the source contact metal is electrically connected to the source region, and the drain contact metal is electrically connected to the drain region.

In order to the make the aforementioned and other objects, features and advantages of the present invention comprehensible, a preferred embodiment accompanied with figures is described in detail below.

DESCRIPTION OF EMBODIMENTS

Figure 1:
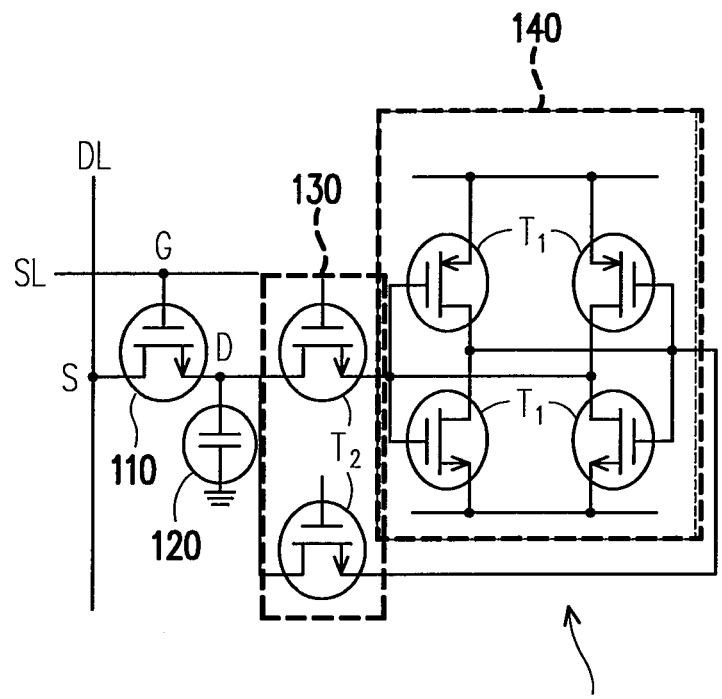
FIG. 1 is a circuit diagram of a conventional pixel structure.
Figure 2:
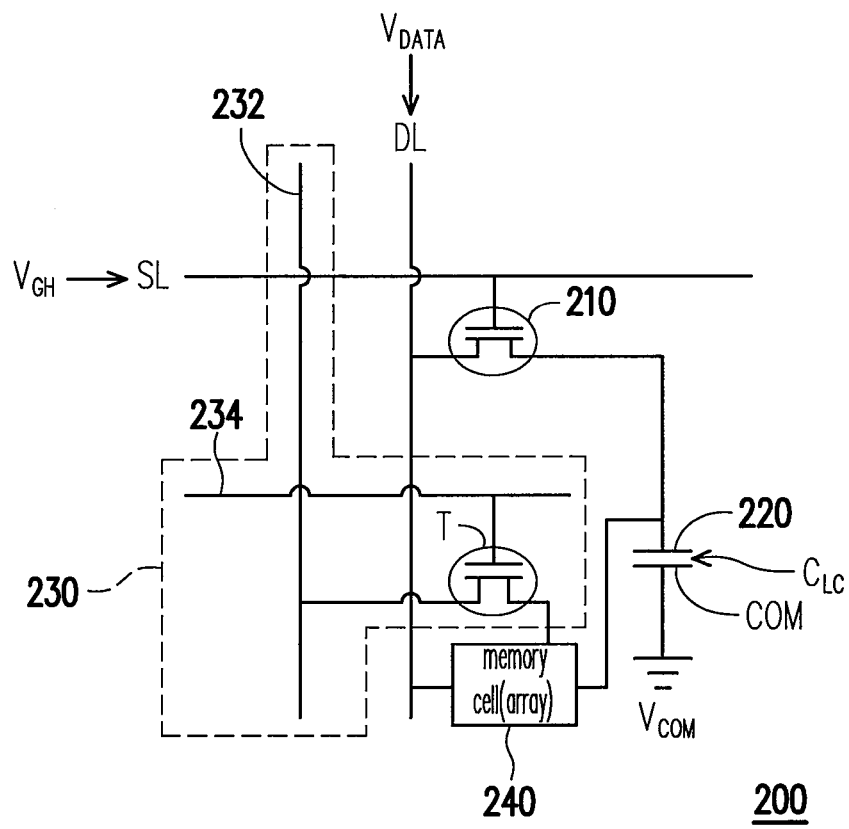
FIG. 2 is a circuit diagram of a pixel structure according to the present invention.

FIG. 2 is a circuit diagram of a pixel structure according to the present invention. Referring to FIG. 2, a pixel structure 200 of the present invention is suitable for being electrically connected to a scan line SL and a data line DL, and includes an active device 210, a pixel electrode 220, a control circuit 230, and a memory cell 240. The pixel electrode 220 is electrically connected to the scan line SL and the data line DL through the active device 210. The memory cell 240 is electrically connected between the control circuit 230 and the pixel electrode 220. In the present invention, the active device 210 is, for example, a thin film transistor. The control circuit 230 is composed of, for example, one or more thin film transistors. The memory cell 240 is, for example, a single memory cell or a memory cell array in any form.

As shown in FIG. 2, the pixel electrode 220 electrically connected to the active device 210 is usually disposed below the substrate (such as, a color filter), and a liquid crystal layer fills between the pixel electrode 220 and the common electrode COM, such that the pixel electrode 220, a common electrode COM coupled to the voltage $V_{COM}$, and the liquid crystal layer sandwiched therebetween forms a liquid crystal capacitor $C_{LC}$.

Also referring to FIG. 2, besides the thin film transistor T, the control circuit 230 further includes control lines 232 and 234, wherein the control line 232 is electrically connected to the gate of the thin film transistor T, and the control line 234 is electrically connected to the source of the thin film transistor T. The drain of the thin film transistor T is electrically connected to the memory cell 240.

As shown in FIG. 2, when a high voltage $V_{GH}$ is applied to the scan line SL, the active device 210 is turned on, and meanwhile, the image data $V_{DATA}$ is written to the pixel electrode 220 through the data line DL and the active device 210. When the image data $V_{DATA}$ is written to the pixel electrode 220, under control of the control line 323, control line 324, and the thin film transistor T, the memory cell 240 is in the state that it can be written, and thus the image data $V_{DATA}$ can also be stored in the memory cell 240 through the data line. On the other hand, when the pixel structure 200 is used for displaying the static images, the voltage level of the pixel electrode 220 can be maintained by the image data $V_{DATA}$ stored in the memory cell 240. In other words, under the control of the control line 323, the control line 324, and the thin film transistor T, the voltage level of the pixel electrode 220 is the same as that of the image data $V_{DATA}$, avoiding the deterioration of the image quality. Therefore, it is not necessary to update the data frame by frame through the scan line SL and the data line DL in the present invention.

Several memory cells are illustrated with reference to the embodiments below in the present invention. Since the Oxide-Nitride-Oxide is integrated into the low temperature poly-silicon thin film transistor in the present invention, all of the memory cells illustrated in the present invention can be integrated into the fabrication process of the current low temperature poly-silicon thin film transistor. In other words, when the voltage applied to the control gate is not sufficient to carry out programming or erasing operation, the memory cell structure described below can also act as the thin film transistor.

First Embodiment

Figure 3A:
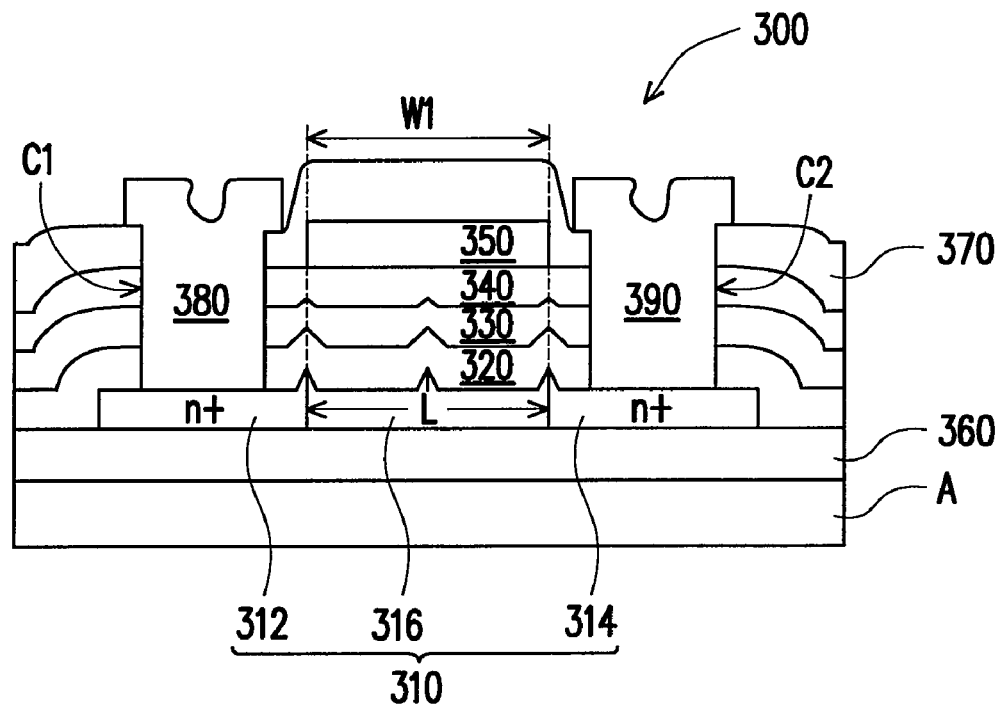
FIGS. 3A and 3B are schematic views of a memory cell according to the first embodiment of the present invention.
Figure 3B:
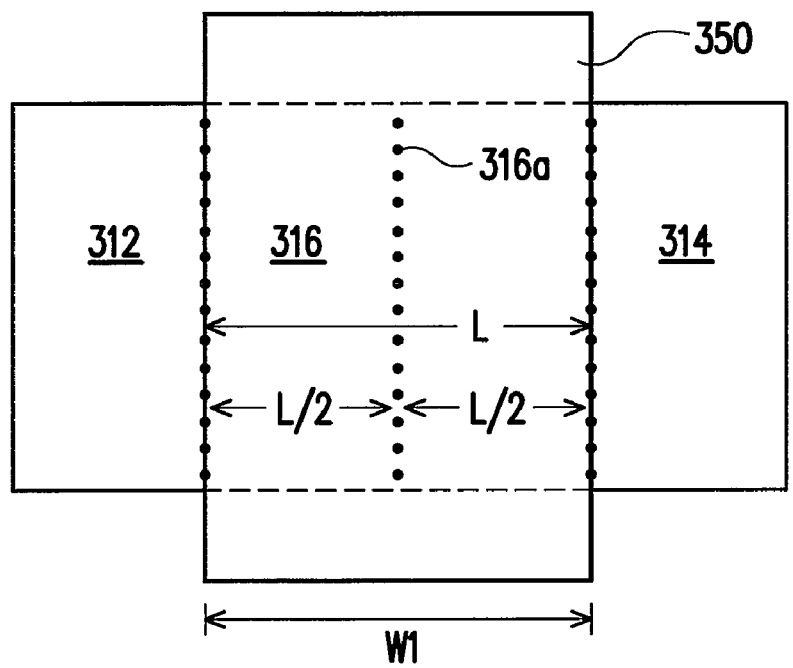

FIGS. 3A and 3B are schematic views of a memory cell according to the first embodiment of the present invention. Referring to FIG. 3A, a memory cell 300 in the embodiment is suitable for being disposed on a substrate A, for example, a glass substrate or other transparent substrates. The memory cell 300 of the first embodiment includes a poly-silicon island 310, a first dielectric layer 320, a trapping layer 330, a second dielectric layer 340, and a control gate 350. The poly-silicon island 310 is disposed on the substrate A and includes a source region 312, a drain region 314, and a channel region 316 located between the source region 312 and the drain region 314, wherein the channel region 316 comprises a plurality of regularly arranged tips 316a on its surface. The first dielectric layer 320 is disposed on the poly-silicon island 310. The trapping layer 330 is disposed on the first dielectric layer 320. The second dielectric layer 340 is disposed on the trapping layer 330. The control gate 350 is disposed on the second dielectric layer 340. Each of the components of the memory cell 300 is illustrated in detail below.

In this embodiment, the source region 312 and the drain region 314 of the poly-silicon island 310 comprises N-type dopants (N+) in high concentration, and the channel region 316 of the poly-silicon island 310 comprises N-type dopants (N−) in low concentration. Taking the memory cell 300 capable of storing 1-bit as an example, the tips 316a of the channel region 316 are arranged in a row parallel to the extending direction of the control gate 350 (shown in FIG. 3B). As shown FIG. 3B, the tips 316a of the channel region 316 are arranged regularly between the source region 312 and the drain region 314, with an approximately equal distance (L/2) from the source region 312 and the drain region 314. In a preferred embodiment of the present invention, the height of the tips 316a of the channel region 316 is in a range of, for example, about 50 nm to about 80 nm. It should be noted that, the range of height mentioned above is not used to limit the scope of the present invention, but any of those skilled in the art can adjust the height of the tips 316a of the channel region 316 depending on the design requirements.

In this embodiment, the first dielectric layer 320 is regarded as a charge tunneling layer. The material of the first dielectric layer 320 comprises, for example, silicon dioxide, or any other dielectric materials capable of serving as a tunneling layer. The thickness of the first dielectric layer 320 is about 150 Å. The trapping layer 330 is adopted for storing charges. The material of the trapping layer 330 comprises, for example, silicon nitride or any other film capable of trapping charges. The thickness of the trapping layer 330 is, for example, about 250 Å. In addition, the second dielectric layer 340 is as adopted for blocking charges. The material of the second dielectric layer 340 comprises, for example, silicon dioxide or any other dielectric material capable of resisting the injected charges. The thickness of the second dielectric layer 340 is, for example, about 300 Å.

As shown in FIG. 3A, to avoid the impurities in the substrate A from diffusing into the poly-silicon island 310, the memory cell 300 in the embodiment further includes a buffer layer 360 sandwiched between the substrate A and the poly-silicon island 310. The buffer layer 360 comprises, for example, a silicon nitride film or any other film capable of blocking impurities.

Referring to FIG. 3A, a protective layer 370 is formed to cover the poly-silicon island 310, the first dielectric layer 320, the trapping layer 330, the second dielectric layer 340, and the control gate 350 in order to enhance the reliability of the memory cell 300. The material of the protective layer 370 comprises, for example, silicon oxide or silicon nitride, or combination thereof.

It should be noted that, to apply a voltage to the source region 312 and drain region 314, the memory cell 300 further comprises a source contact metal 380 electrically connected to the source region 312 and a drain contact metal 390 electrically connected to the drain region 316. More particularly, the source contact metal 380 and the drain contact metal 390 are disposed in the contact window C1 and C2 formed in the first dielectric layer 320, the trapping layer 330, the second dielectric layer 340, and the protective layer 370 respectively. Thus, the source contact metal 380 is electrically connected to the source region 312 through the contact window C1, and the drain contact metal 390 is electrically connected to the drain region 316 through the contact window C2.

As shown in FIGS. 3A and 3B, the control gate 350 is located above the channel region 316, and the control gate 350 is not overlapped with the source region 312 and the drain region 316. In other words, the width W1 of the control gate 350 in this embodiment is substantially the same as the length L of the channel region 316.

It should be noted that, the poly-silicon island 310, the first dielectric layer 320, the trapping layer 330, the second dielectric layer 340, and the control gate 350 mentioned above constitutes an operable memory cell. The buffer layer 360, the protective layer 370, the source contact metal 380, and the drain contact metal 390 are optional components. Therefore, those skilled in the art may include or omit, or make modifications to those components with reference to the specification, without departing from the scope of the present invention.

For programming the memory cell 300, a high voltage (for example, 40 volts) is applied to the control gate 350. As a result, the control gate 350 attracts the electrons from the channel region 316 causing the electrons to tunnel through the first dielectric layer 320 into the trapping layer 330 where the electrons get trapped. On the other hand, for erasing the memory cell 330, a low voltage (for example, −20 volts) is applied on the control gate 350. As a result the control gate 350 exerts a repulsive force to push the electrons out of the trapping layer 330 or attracts holes from the channel region 316 causing the holes to tunnel through the first dielectric layer 320 into the trapping layer 330 where the holes recombines with the electrons previously trapped in the trapping layer 330. It should be noted that, because the channel region 316 comprises a plurality of regularly arranged tips 316a on its surface, comparatively lower voltage is required for programming or erasing the memory cell 330. Furthermore, the operation speed of the memory cell 300 can be further enhanced.

Figure 4A:
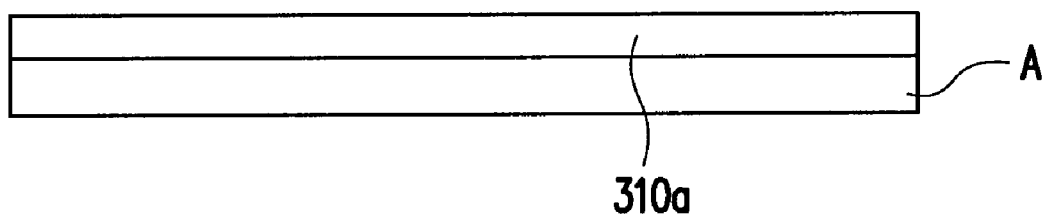
FIGS. 4A to 4E are schematic views illustrating the process steps of the fabrication of the memory cell shown in FIG. 3A.

FIGS. 4A to 4E are schematic views illustrating the process steps of the fabrication of the memory cell shown in FIG. 3. Referring to FIG. 4A, a substrate A is provided, and an amorphous silicon layer 310a is formed on the substrate A. In this embodiment, the amorphous silicon layer 310a is formed by performing a chemical vapor deposition (CVD) process. It should be noted that, a buffer layer (not shown) can be optionally formed before forming the amorphous silicon layer 310a in order to block the impurities to diffuse from the substrate A.

Figure 4B:
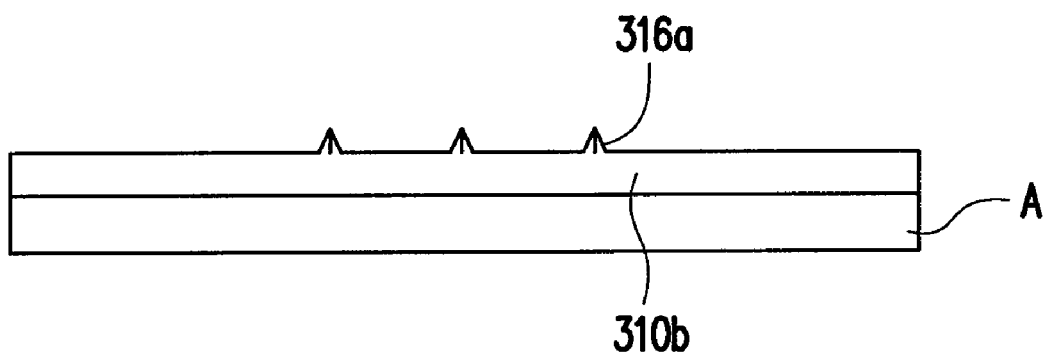

Referring to FIG. 4B, the amorphous silicon layer 310a is melted and re-crystallized to form a poly-silicon layer 310b comprising a plurality of regularly arranged tips 316a on its surface. For example, the re-crystallization of the amorphous silicon layer 310a may be accomplished using the SLS-LTPS technology.

Figure 4C:
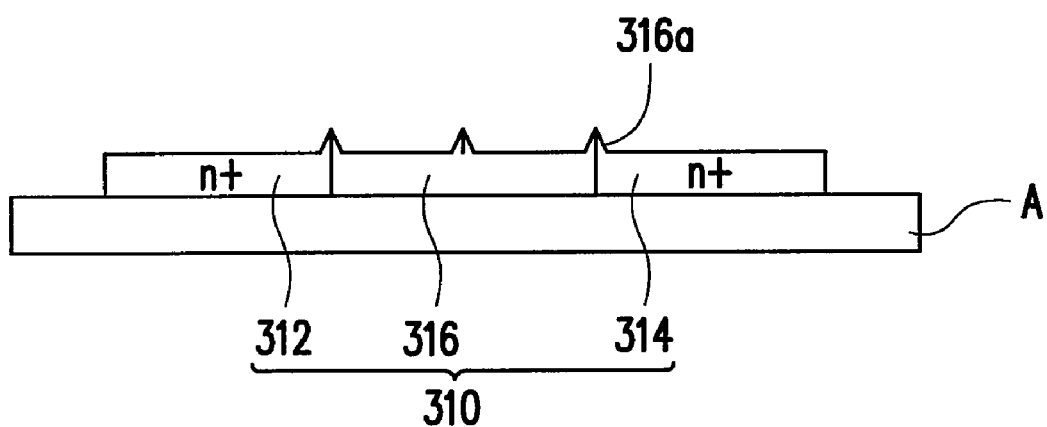

Referring to FIG. 4C, the poly-silicon layer 310b is patterned, and then the patterned poly-silicon layer 310b is doped to form a source region 312 and a drain region 314. Thus, a poly-silicon island 310 comprising the source region 312, the drain region 314 and the channel region 316 is formed.

Figure 4D:
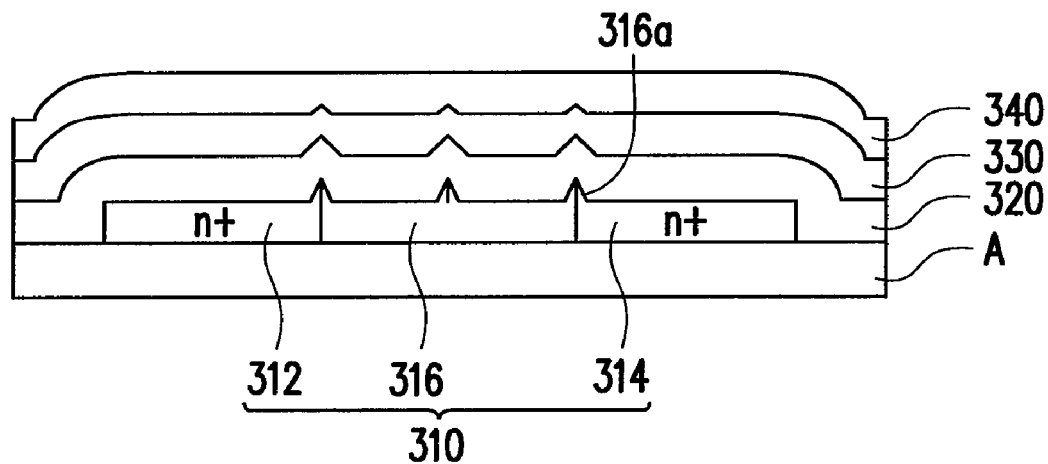

Referring to FIG. 4D, a first dielectric layer 320, a trapping layer 330 and a second dielectric layer 340 are sequentially formed on the poly-silicon island 310. In this embodiment, the first dielectric layer 320, the trapping layer 330 and the second dielectric layer 340 are formed by using, for example, the CVD process.

Figure 4E:
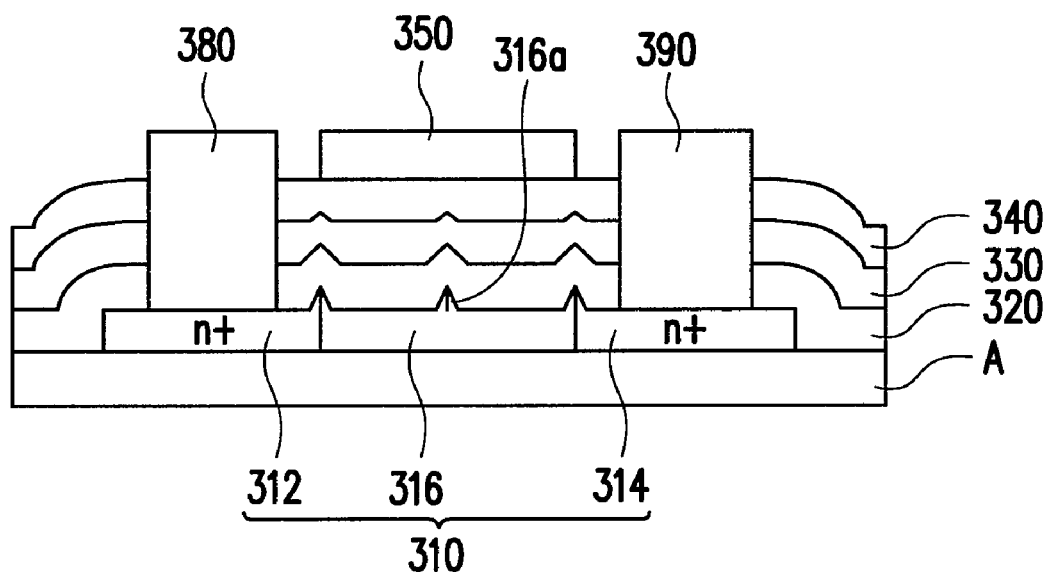

Referring to FIG. 4E, a control gate 350 is formed on the second dielectric layer 340. Next, the first dielectric layer 320, the trapping layer 330 and the second dielectric layer 340 are patterned to expose a portion of the source region 312 and the drain region 314. Finally, a source contact metal 380 and a drain contact metal 390 are respectively formed on the exposed source region 312 and drain region 341.

It should be noted that, a protective layer (not shown) may be formed to cover the control gate 350 before the first dielectric layer 320, the trapping layer 330, and the second dielectric layer 340 are patterned.

Second Embodiment

Figure 5A:
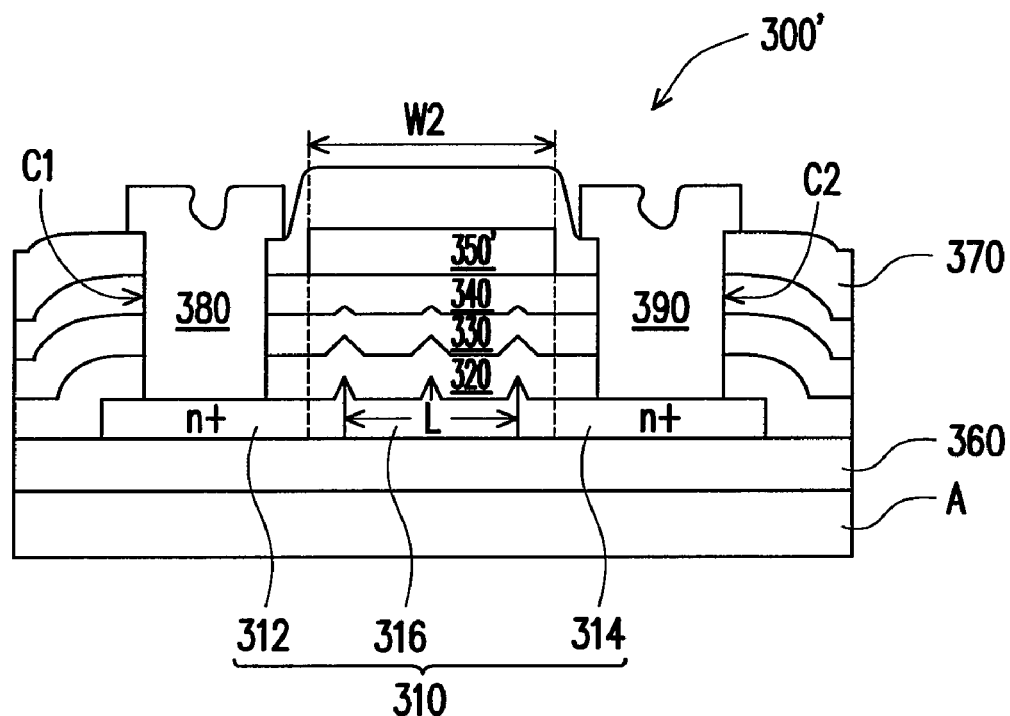
FIGS. 5A and 5B are schematic views of a memory cell according to the second embodiment of the present invention.
Figure 5B:
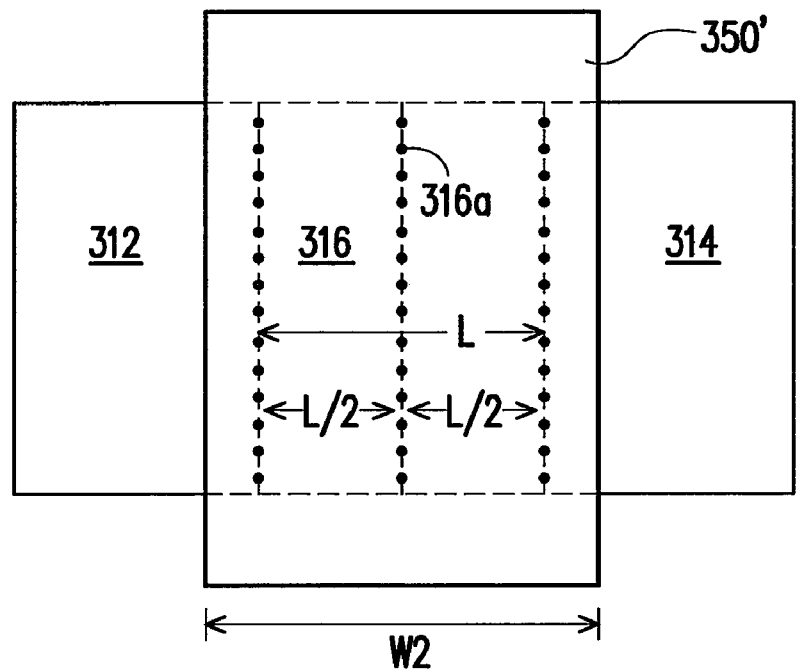

FIGS. 5A and 5B are schematic views of the memory cell according to the second embodiment of the present invention. Referring to FIGS. 5A and 5B, the memory cell 300' of this embodiment is similar to that of the first embodiment described above, except that the control gate 350' in this embodiment is located above a portion of the source region 312, and a portion of the drain region 314 and the channel region 316. In other words, the width W2 of the control gate 350' of this embodiment is larger than the length L of the channel region 316.

As for the memory cell 300' of this embodiment, because the control gate 350' partially overlaps on the source region 312 and the drain region 314, and the concentration of the dopants in the source region 312 and the drain region 314 is higher than that of the channel region 316, the memory cell 300' has a better programming and erasing capabilities compared to the memory cell 300 of the first embodiment.

Figure 6A:
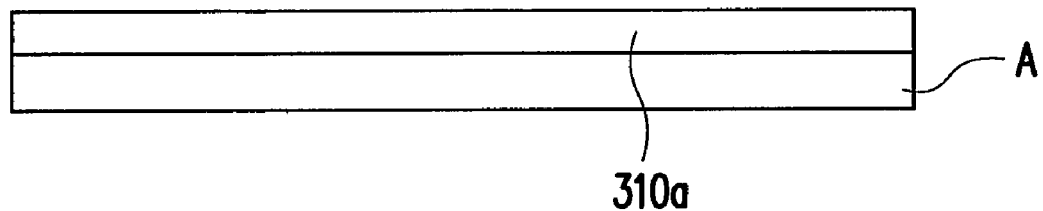
FIGS. 6A to 6E are schematic views illustrating the process steps of the fabrication of the memory cell shown in FIG. 5A.
Figure 6B:
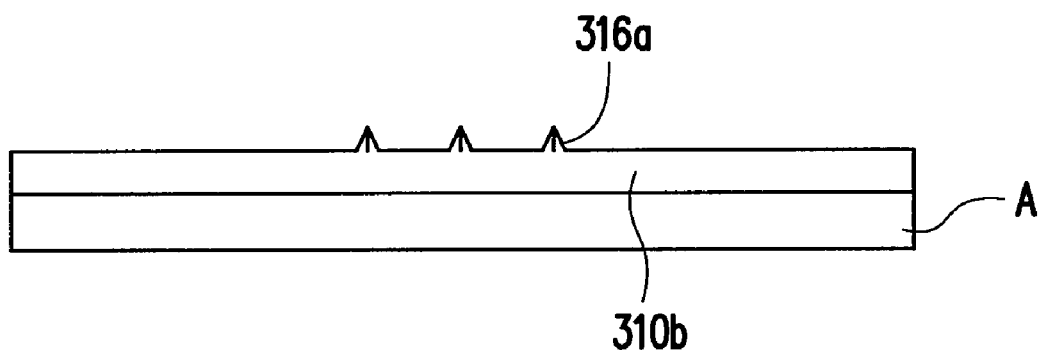
Figure 6C:
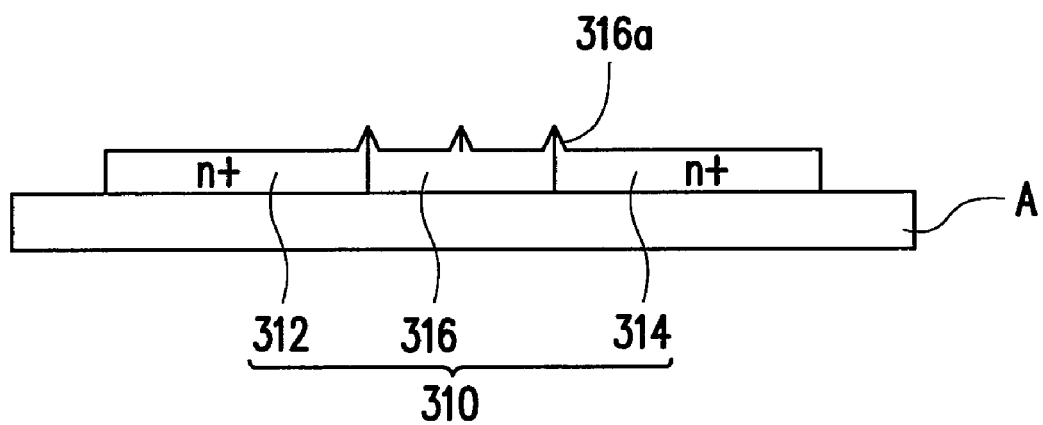
Figure 6D:
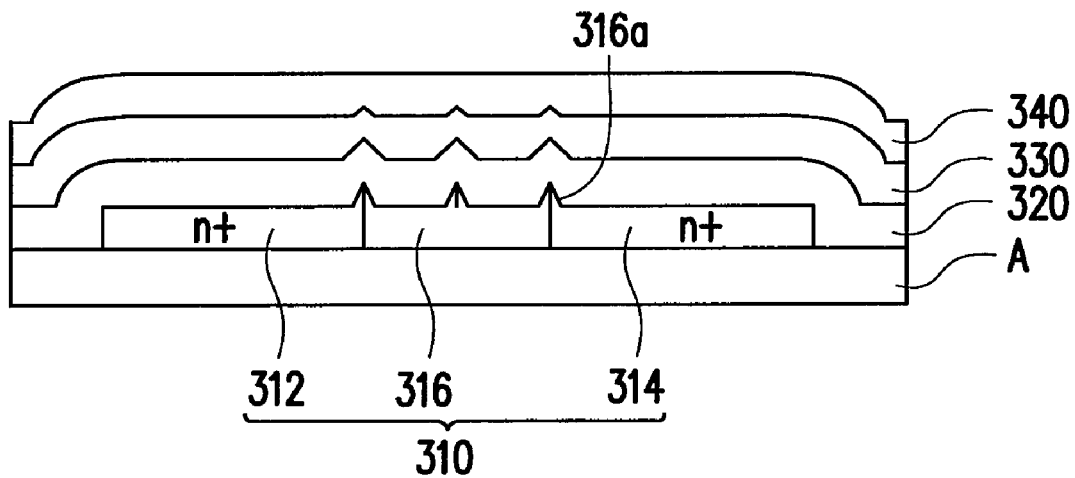
Figure 6E:
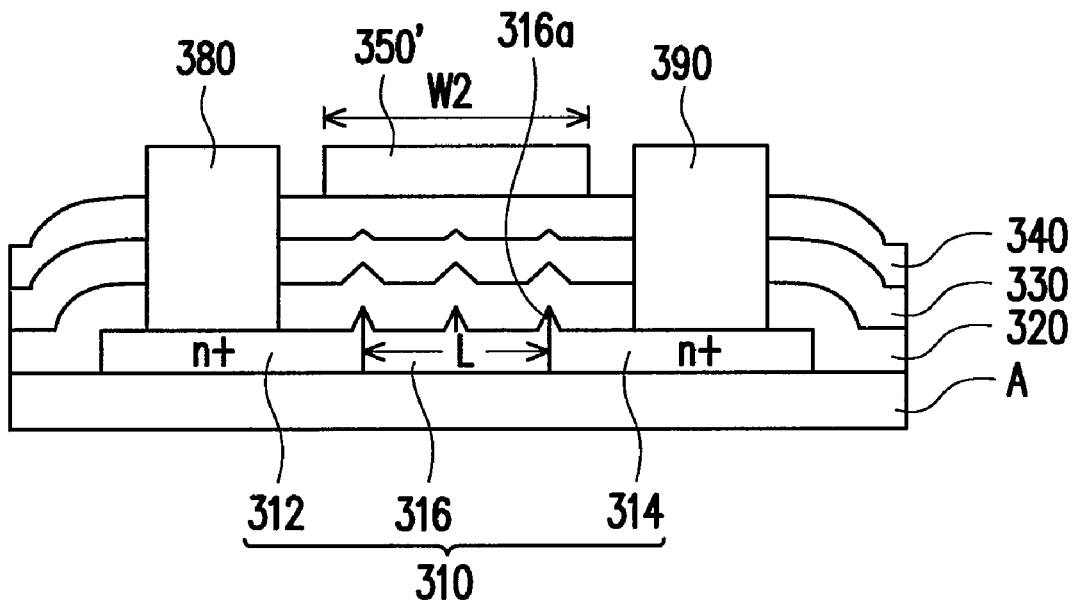

FIGS. 6A to 6E are schematic views illustrating the process steps of the fabrication of the memory cell shown in FIG. 5A. Referring to FIGS. 6A and 6E, the fabrication process of the memory cell 300' of this embodiment is similar to that of the first embodiment, except that the width W2 of the control gate 350' (shown in FIG. 6E) is larger than the length L of the channel region 316.

Third Embodiment

Figure 7A:
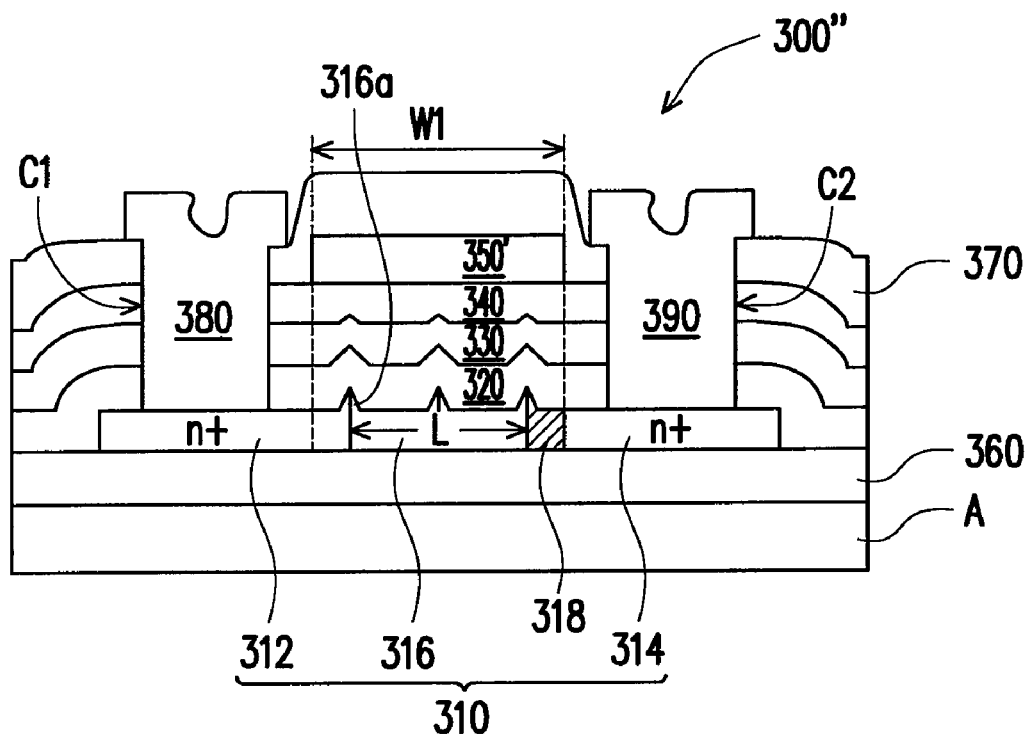
FIGS. 7A, 7B, and 7C are schematic views of a memory cell according to the third embodiment of the present invention.
Figure 7B:
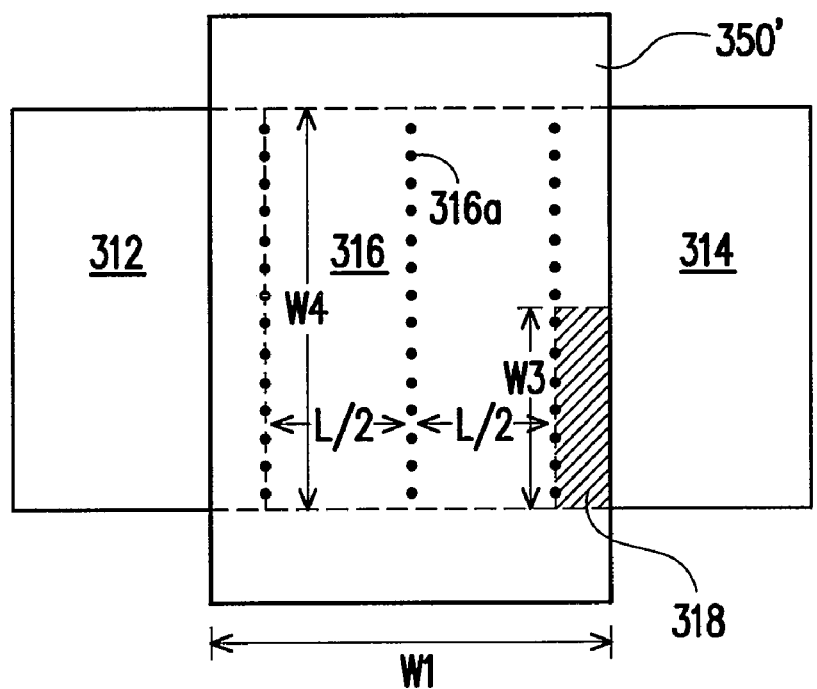
Figure 7C:
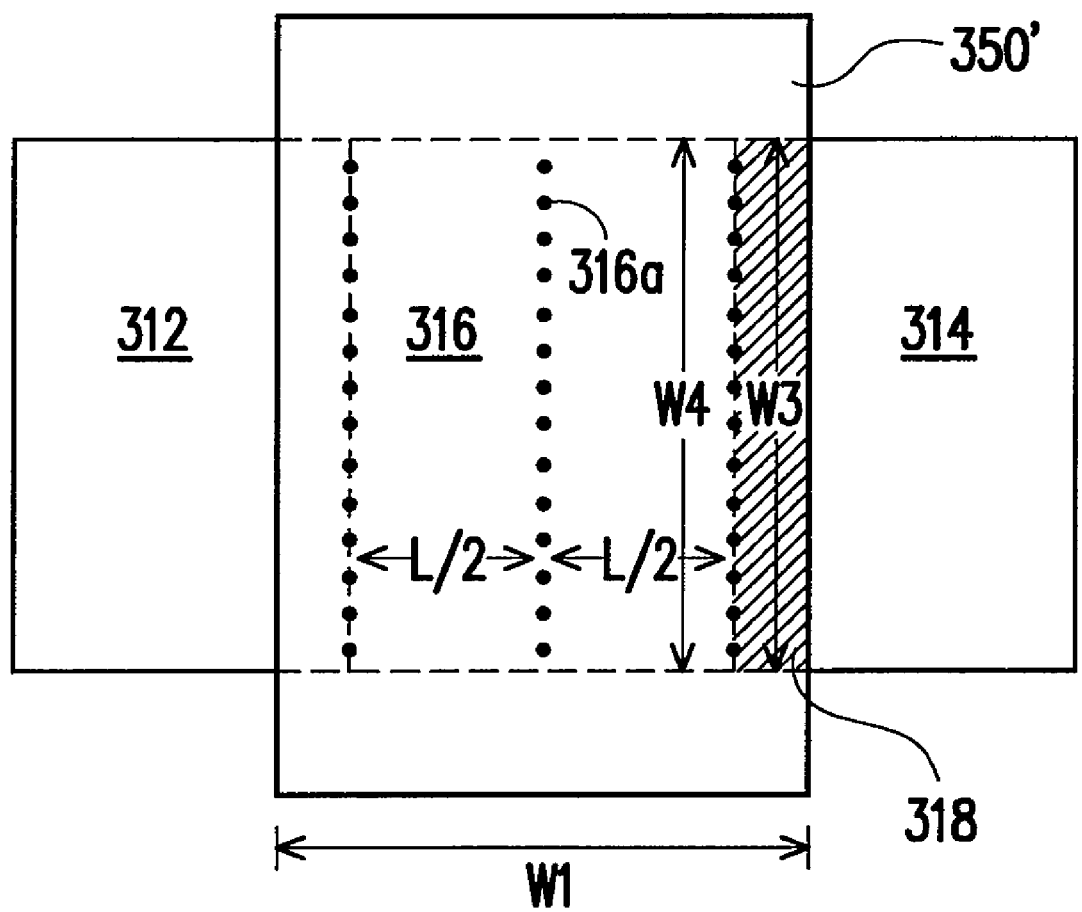

FIGS. 7A, 7B and 7C are schematic views of the memory cell according to the third embodiment of the present invention. Referring to FIGS. 7A, 7B, and 7C, the memory cell 300" of this embodiment is similar to that of the first embodiment except that the poly-silicon island 310 further comprises a charge induced doped region 318 located between the channel region 316 and the drain region 314, and a charge induced doped region 318 located below the control gate 350'.

As shown in FIGS. 7B and 7C, the width W3 of the charge induced doped region 318 is smaller than the width W4 of the channel region 316 (shown in FIG. 7B), or identical to the width W4 of the channel region 316 (shown in FIG. 7C). The charge induced doped region 318 is, for example, P-type doped region. It should be noted that, since the charge induced doped region 318 is P-type doped region, and the drain region 314 is N-type doped region, a P-N junction between the charge induced doped region 318 and the drain region 314 provide the memory cell 300" have a better programming and erasing capabilities.

Figure 8A:
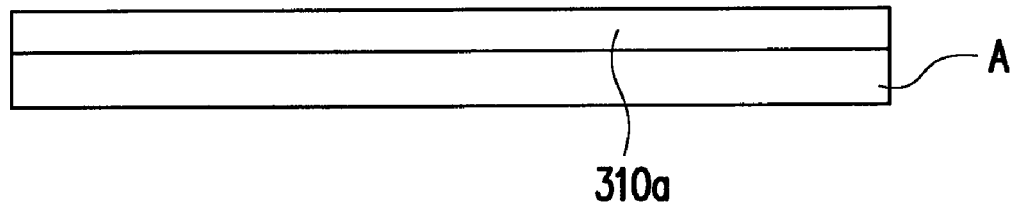
FIGS. 8A to 8E are schematic views illustrating the process steps of the fabrication of the memory cell shown in FIG. 7A.
Figure 8B:
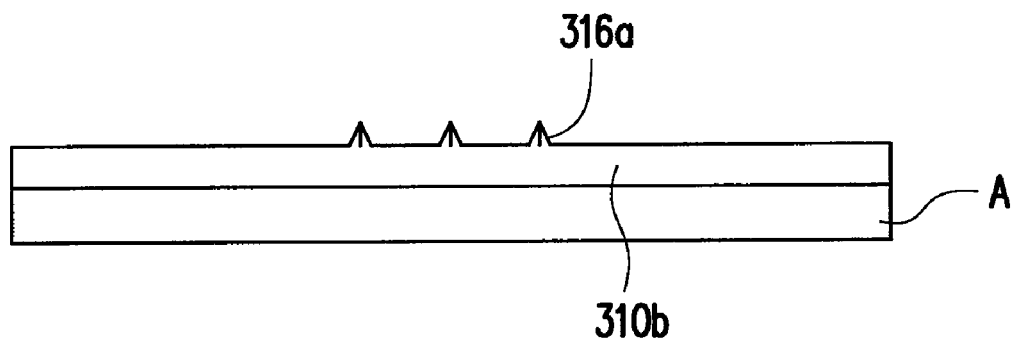
Figure 8C:
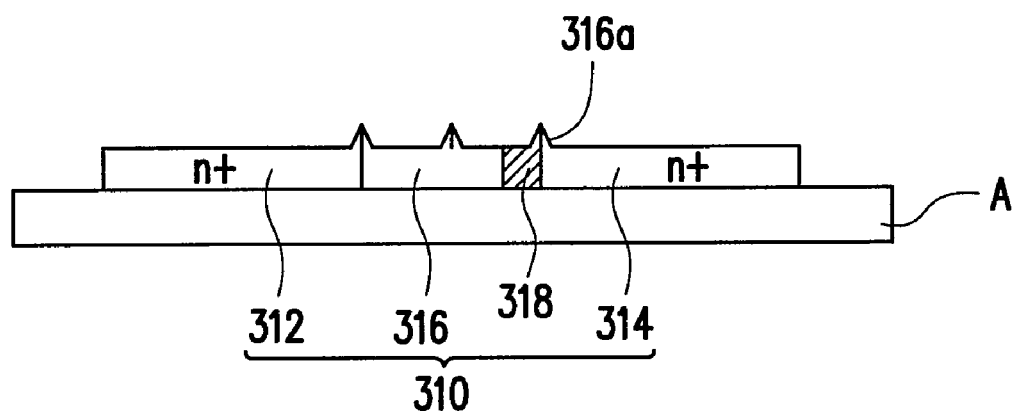
Figure 8D:
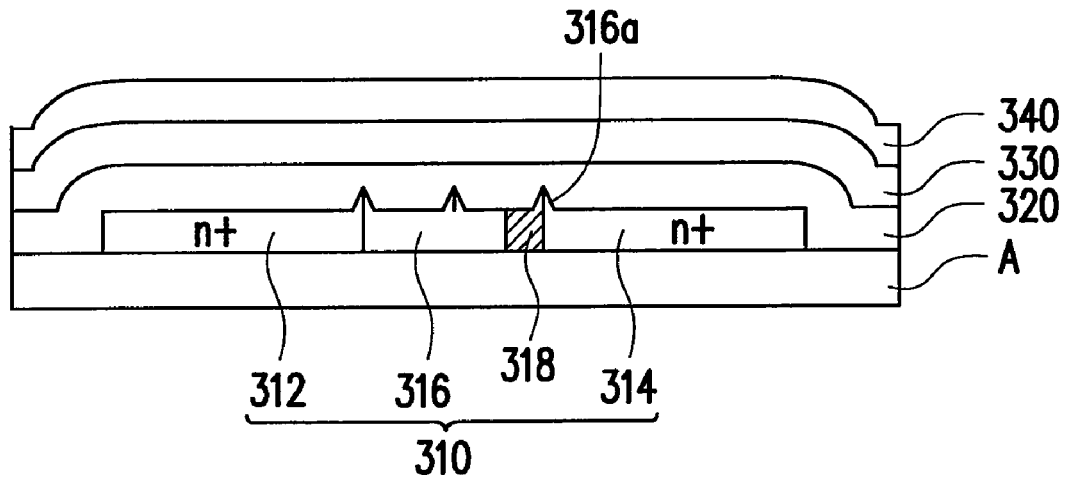
Figure 8E:
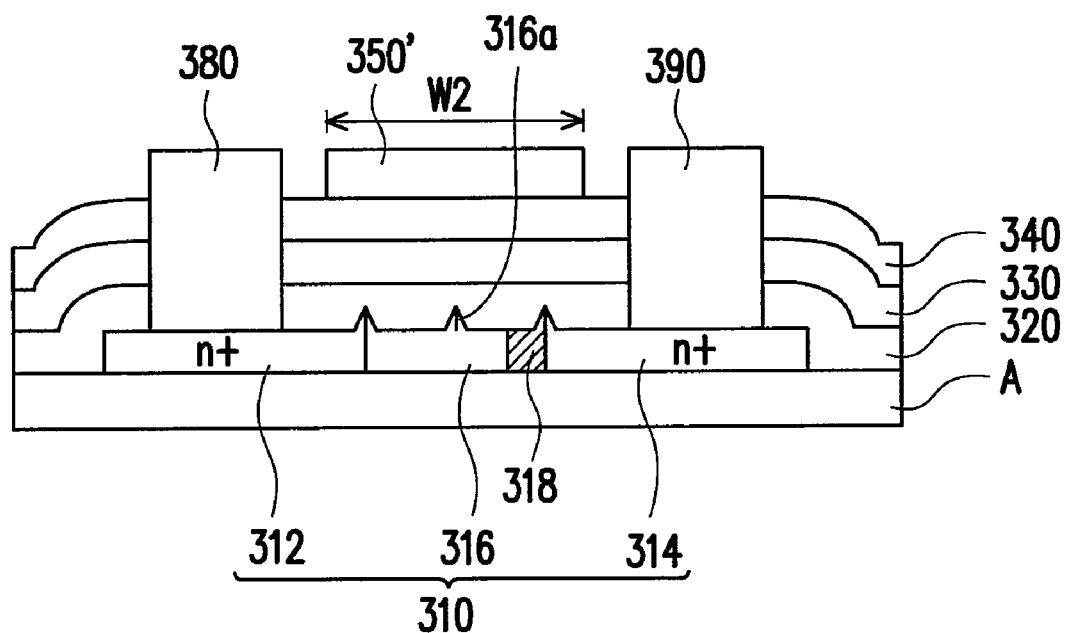

FIGS. 8A to 8E are schematic views of process steps of the fabrication of the memory cell shown in FIG. 7A. Referring to FIGS. 8A to 8E, the fabrication process of the memory cell 300" of this embodiment is similar to that of the second embodiment except that a charge induced doped region 318 (as shown in FIG. 8E) is formed between the channel region 316 and the drain region 314.

Fourth Embodiment

Figure 9A:
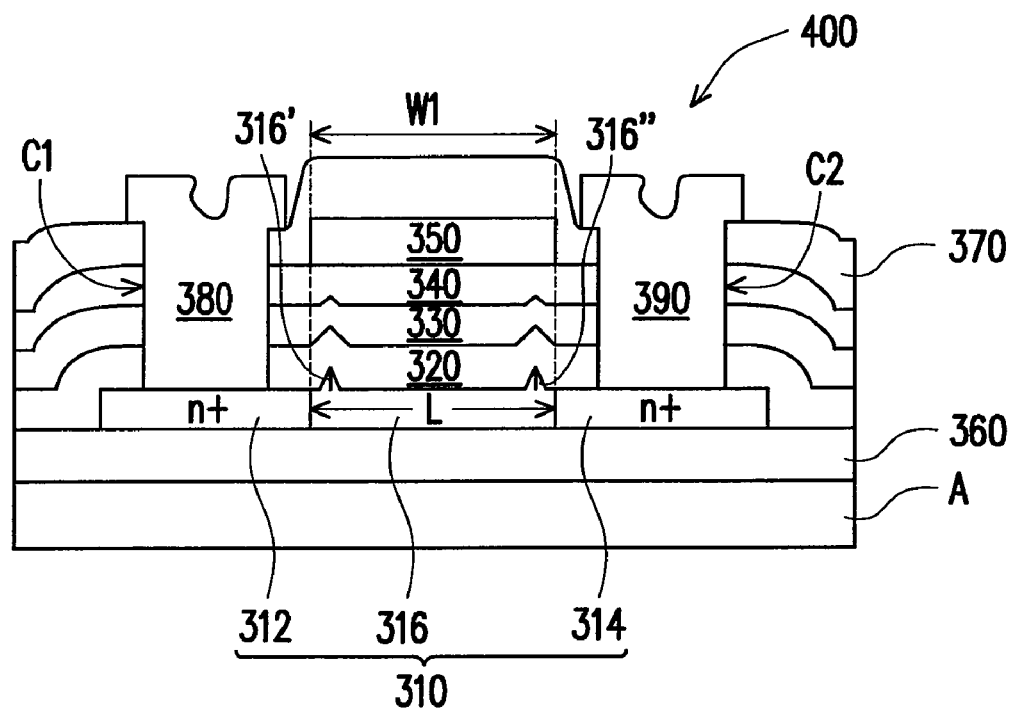
FIGS. 9A and 9B are schematic views of a memory cell according to the fourth embodiment of the present invention.
Figure 9B:
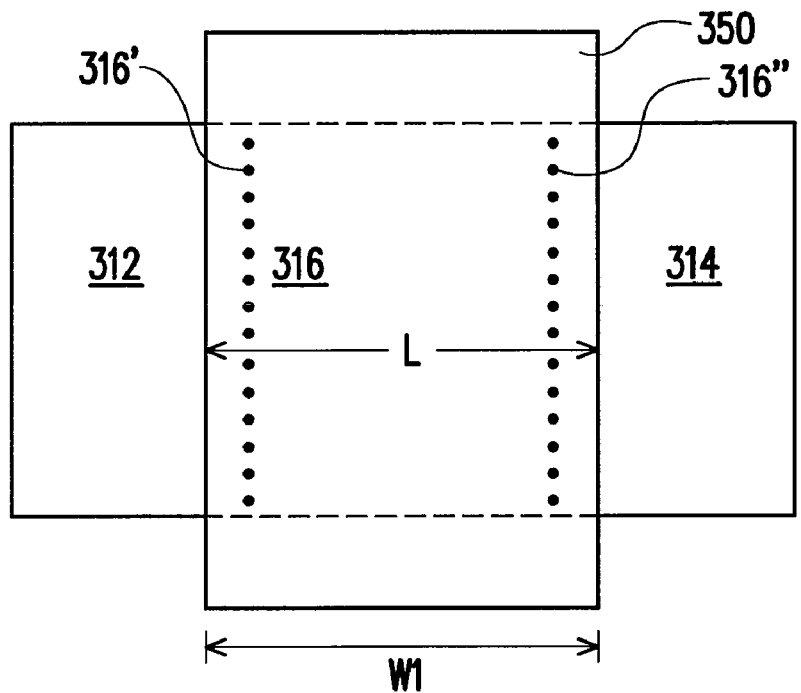

FIGS. 9A and 9B are schematic views of a memory cell according to the fourth embodiment of the present invention. Referring to FIGS. 9A and 9B, the memory cell 400 is similar to that of the first embodiment except that in the memory cell 400 of this embodiment, the channel region 316 comprises a plurality of first tips 316a' arranged in a row parallel to the extending direction of the control gate 350, and a plurality of second tips 316a" arranged in a row parallel to the extending direction of the control gate 350, wherein the first tips 316a' are closer to the source region 312 and the second tips 316a" are closer to the drain region 314. The memory cell 400 of this embodiment is capable of storing 2-bit data.

Fifth Embodiment

Figure 10A:
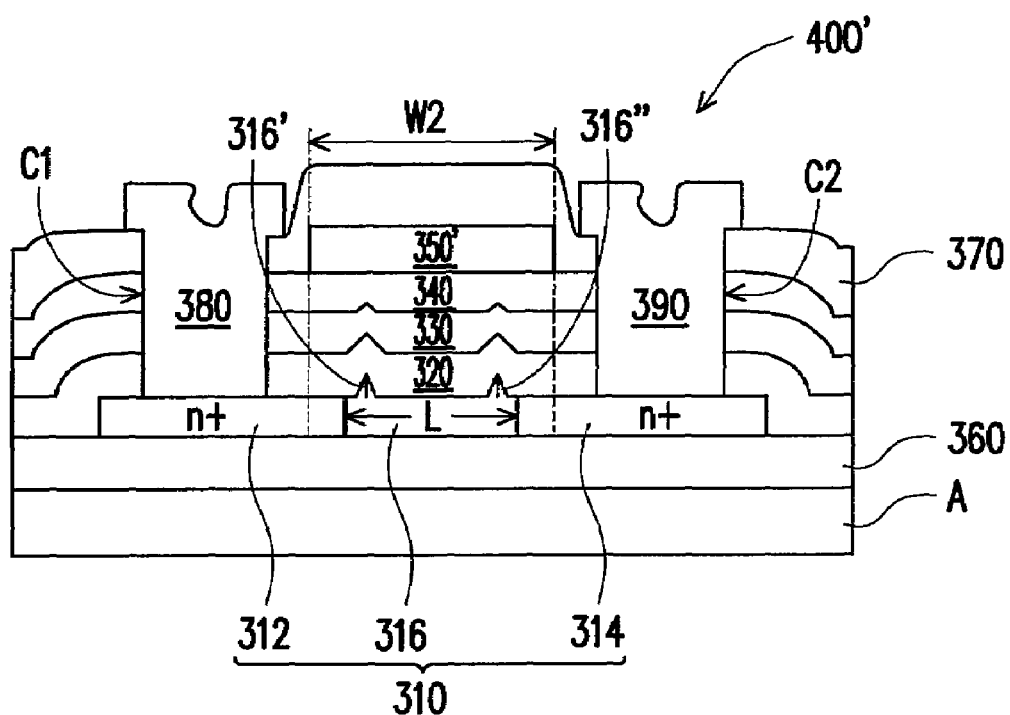
FIGS. 10A and 10B are schematic views of a memory cell according to the fifth embodiment of the present invention.
Figure 10B:
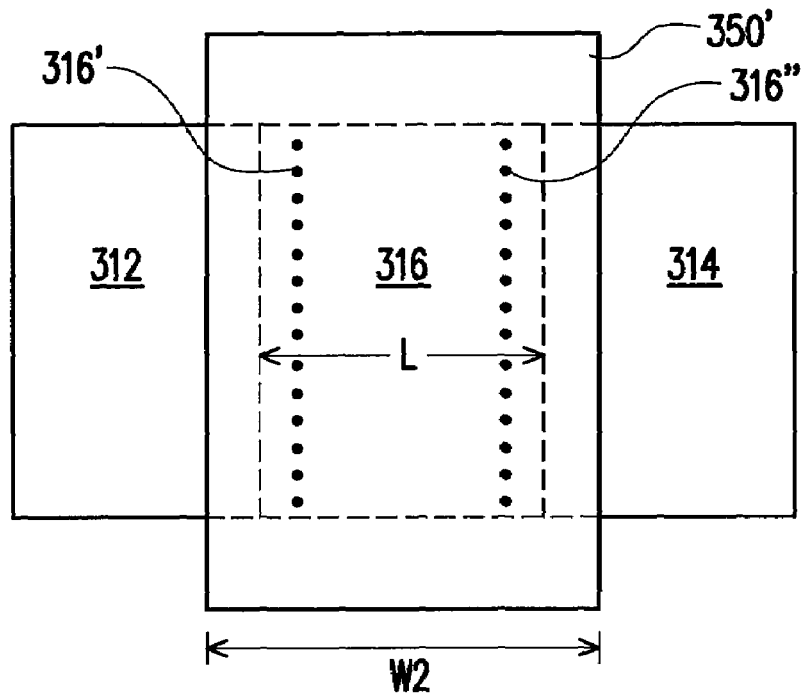

FIGS. 10A and 10B are schematic views of a memory cell according to the fifth embodiment. Referring to FIGS. 10A and 10B, the memory cell 400' of this embodiment is similar to that of the second embodiment except that in the memory cell 400' of this embodiment, the channel region 316 comprises a plurality of first tips 316a' arranged in a row parallel to the extending direction of the control gate 350 and a plurality of second tips 316a" arranged in a column parallel to the extending direction of the control gate 350 on the surface, wherein the first tips 316a' are closer to the source d region 312, and the second tips 316" are closer to the drain region 314.

Sixth Embodiment

Figure 11A:
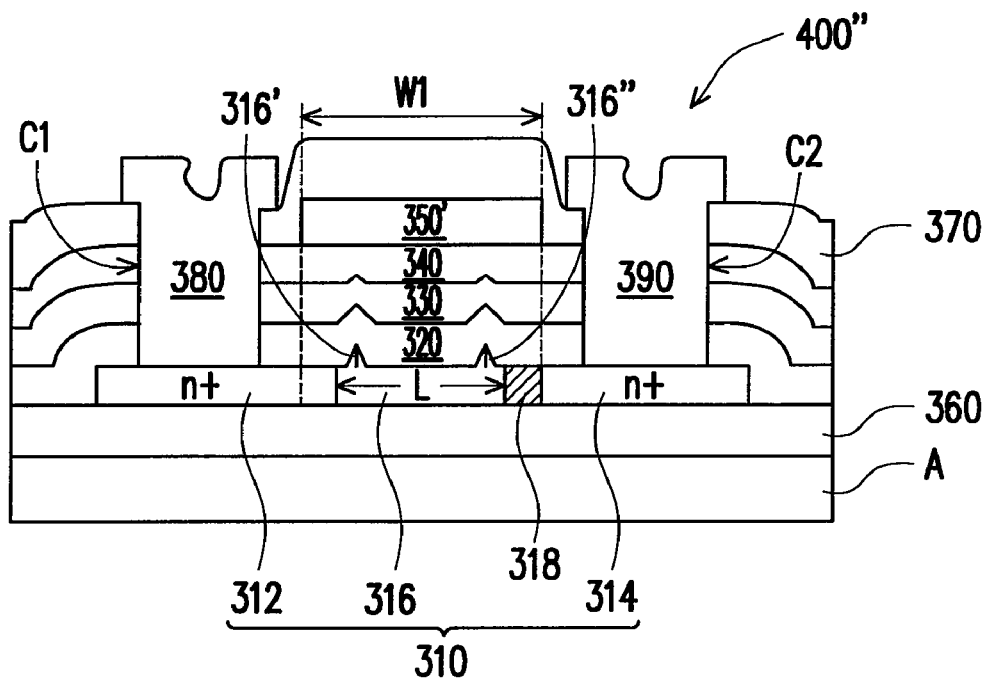
FIGS. 11A, 11B, and 11C are schematic views of a memory cell according to the sixth embodiment of the present invention.
Figure 11B:
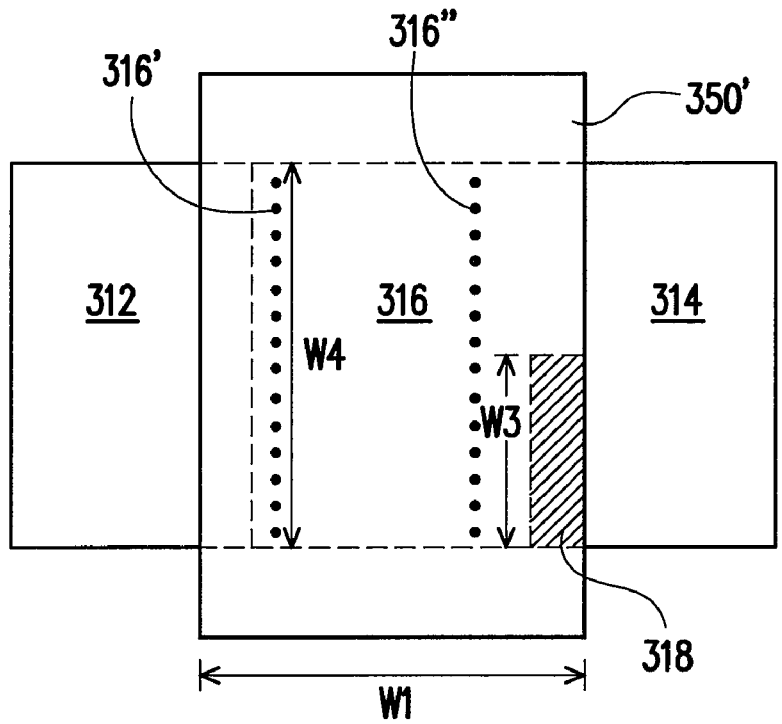
Figure 11C:
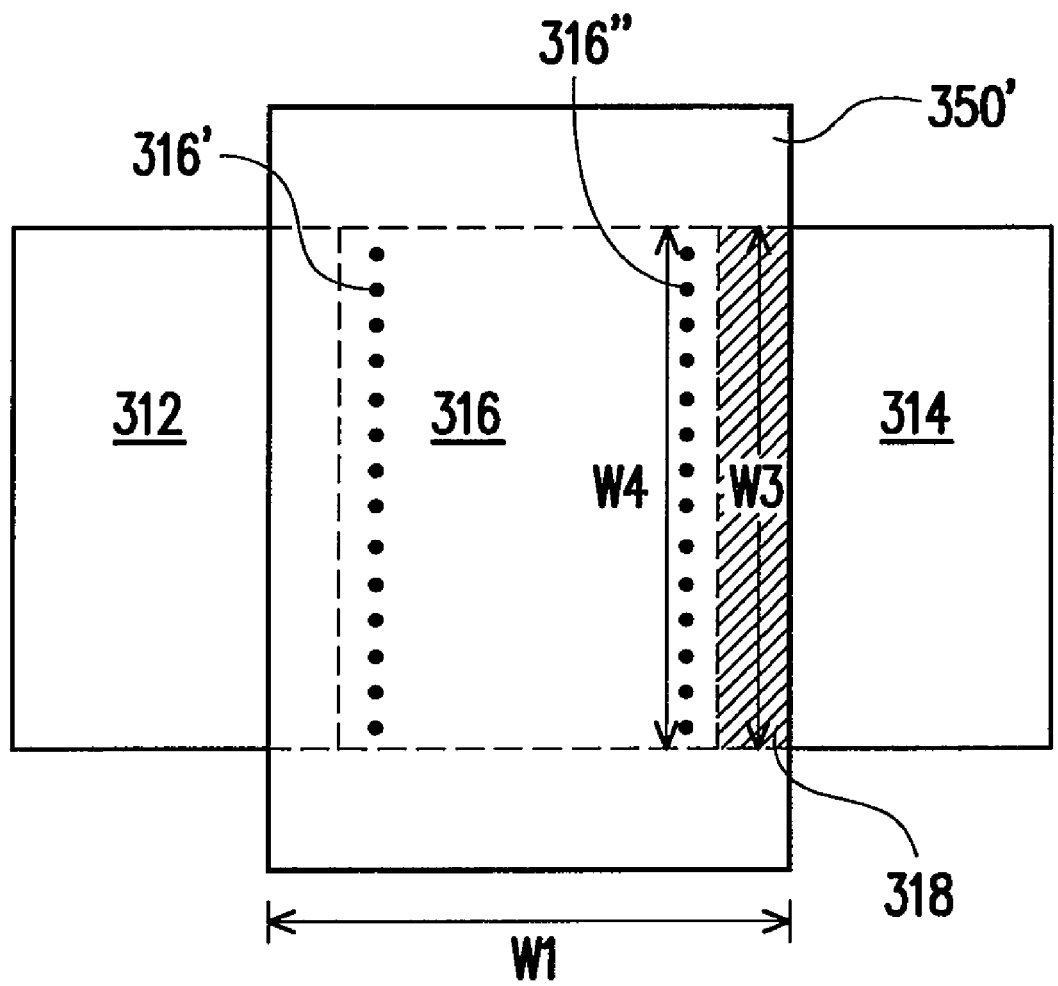

FIGS. 11A, 11B, and 11C are schematic views of a memory cell according to the sixth embodiment of the present invention. Referring to FIGS. 11A, 11B, and 11C, the memory cell 400" of this embodiment is similar to that of the third embodiment except that in the memory cell 400" of this embodiment, the channel region 316 comprises a plurality of first tips 316a' arranged in a row parallel to the extending direction of the control gate 350 and a plurality of second tips 316a" arranged in a row parallel to the extending direction of the control gate 350, wherein the first tips 316a' are closer to the source region 312 and the second tips 316a" are closer to the drain region 314.

According to an embodiment of the present invention, the poly-silicon layer is formed on the glass substrate by using SLS-LTPS technology such that the tips are formed at the grain boundary. Since the positions of the tips can be effectively controlled through the SLS-LTPS technology, the tips on the poly-silicon layer can be easily aligned with other components in the memory cell, and therefore the problems due to mis-alignment can be effectively reduced.

According to an embodiment of the present invention, the grain size of the poly-silicon layer is about 3.5 μm and the height of the tips at the grain boundary is about 80nm. The first dielectric layer comprises a silicon dioxide layer and has a thickness of about 150 nm. The trapping layer comprises a silicon nitride layer and a thickness of about 250 nm. The second dielectric layer comprises a silicon dioxide layer and has a thickness of about 300 nm. The source/drain region is with As ions. The control gate comprises an MoW layer (formed by sputtering) and has a thickness of about 300 nm. Furthermore, the length of the channel region is about 3 μm and the width of the channel region is about 3.5 μm. The portion of the source/drain region overlapped by the control gate is about 1 μm.

Figure 12A:
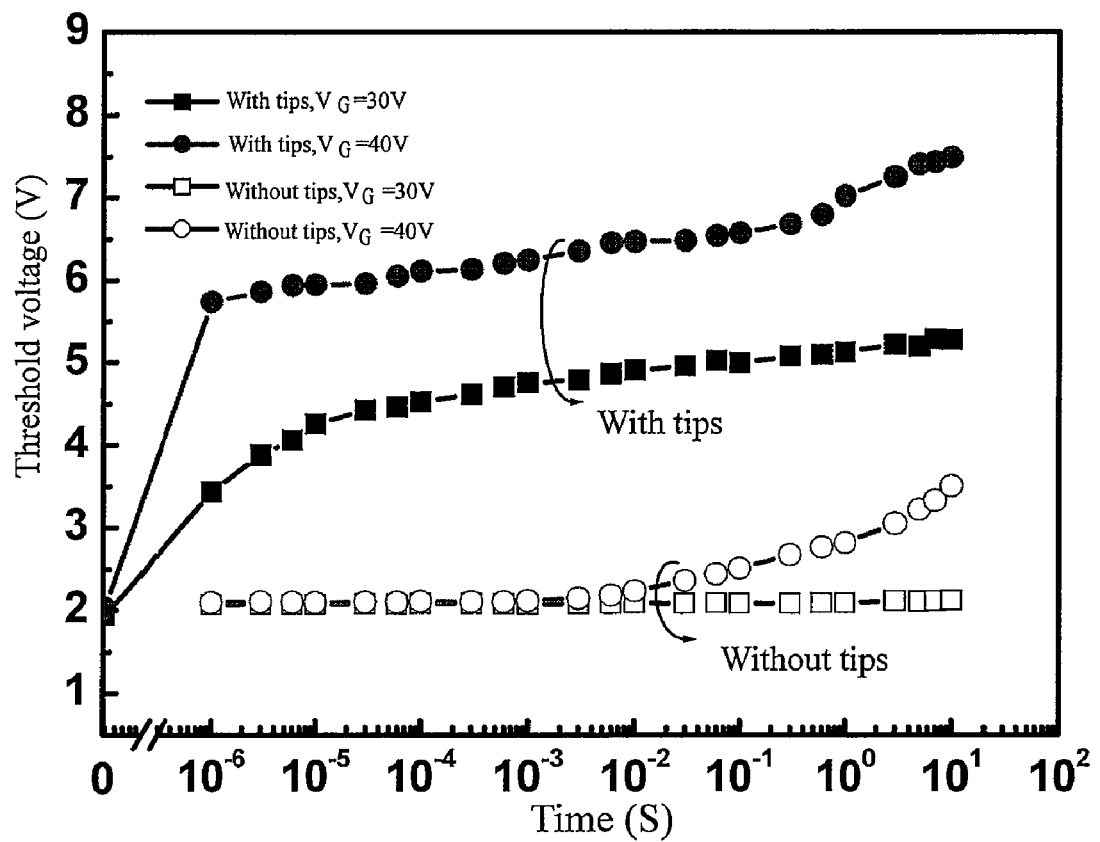
FIGS. 12A and 12B show the FN programming properties and FN erasing characteristics of the memory cell according to the present invention.
Figure 12B:
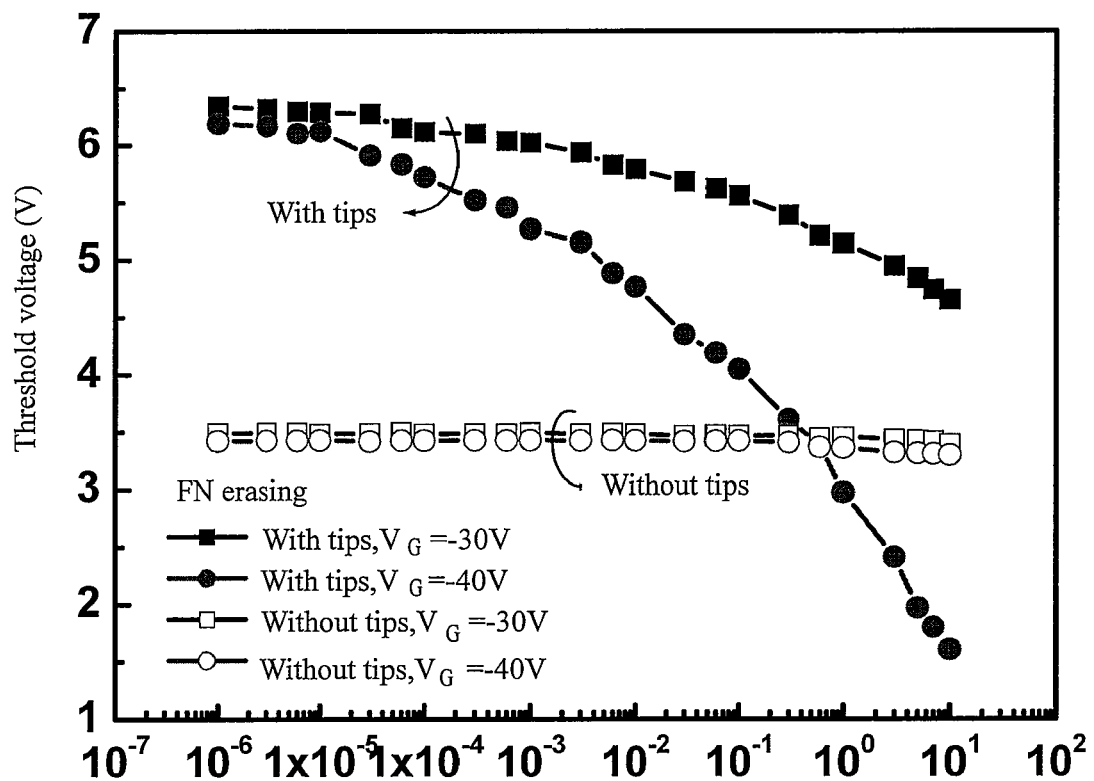

FIGS. 12A and 12B shows Fowler-Nordheim (FN) programming and Fowler-Nordheim (FN) erasing characteristics of the memory cell according to an embodiment of the present invention. As shown FIG. 12A, in a conventional memory cell (without silicon tips), when a voltage of 30 volts is applied to the control gate to program the memory cell, the problem of threshold voltage shift does not occur but the programming speed is substantially slow. As shown in FIG. 12A, even when a voltage of 40 volts is applied to the control gate, the programming speed of the memory cell is still substantially slow. To the contrary, the threshold voltage shift of the memory cell of the present invention (with silicon tips) is about 2 volts, and the programming speed faster than that of the conventional memory.

Next, referring to FIG. 12B, in the memory cell (with silicon tips) of the present invention, when a voltage of about −30 volts or −40 volts is applied to the control gate to carry out the FN erasing action, the erasing action can be completed within 100 ms. It should be noted that the silicon tips regularly arranged on the surface of the channel region may effectively enhance the FN programming/erasing properties of the memory cell.

For further reducing the operation voltage of the memory cell, the memory cell of the present invention proposes programming action through the channel hot electron (CHE) and erasing action through the band-to-and hot hole (BBHH).

Figure 13A:
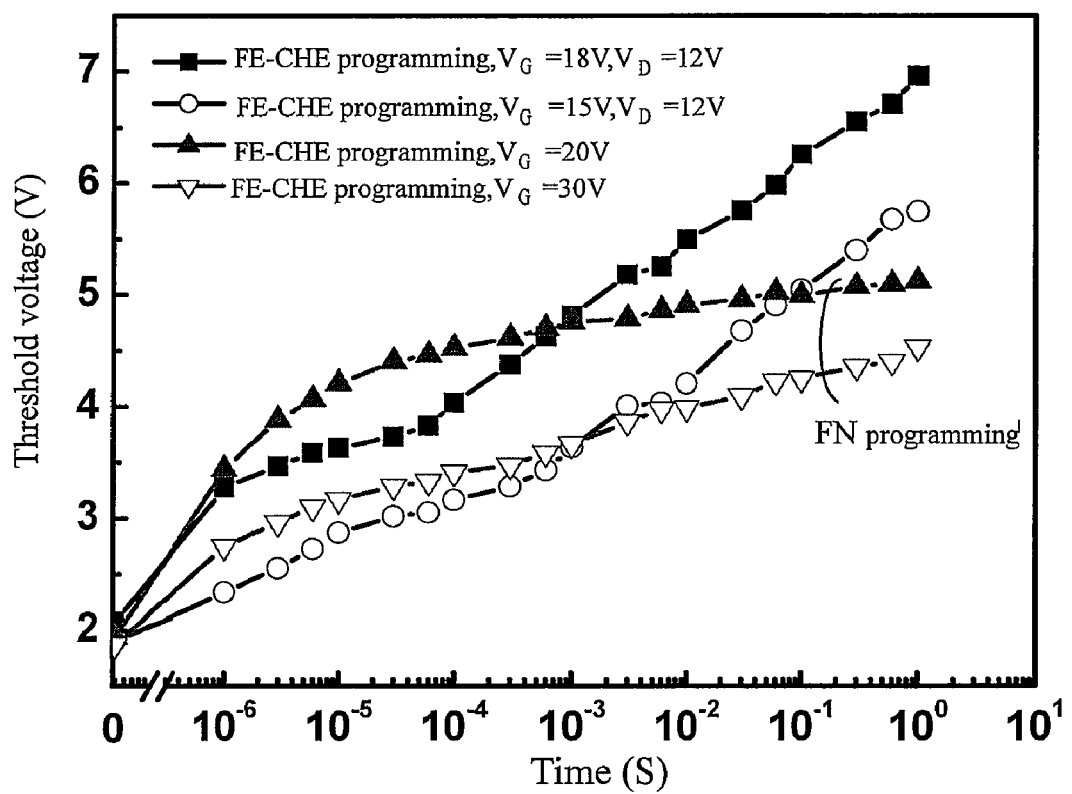
FIGS. 13A and 13B show the CHE programming properties and BBHH erasing characteristics of the memory cell according to the present invention.
Figure 13B:
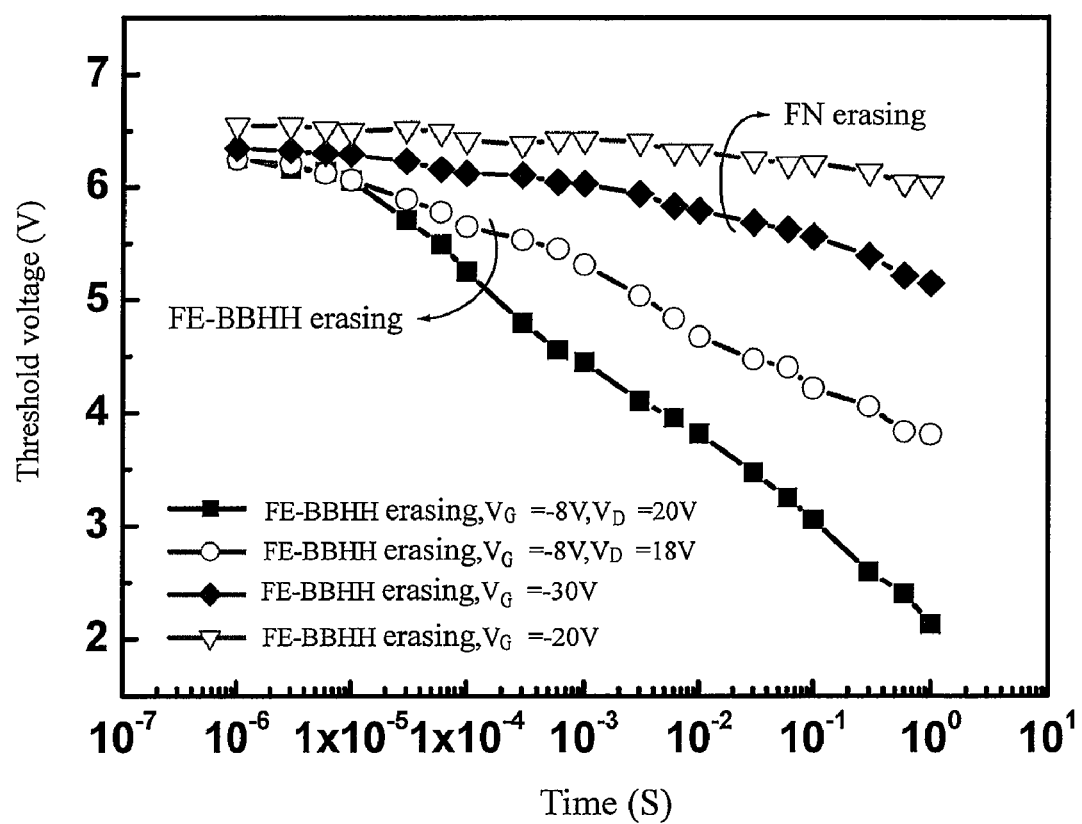

FIGS. 13A and 13B illustrate the CHE programming and BBHH erasing properties of the memory cell of the present invention. As shown FIG. 13A, when a voltage of 18 volts is applied to the control gate, and a voltage of 12 volts is applied to the drain region (with the programming time of 10 ms), the programming threshold voltage window of the memory cell is 2.22 volts. It should be noted that the silicon tips formed on the surface of the channel region may effectively enhance both the injection rate of the hot electrons and the programming speed of the memory cell.

Next referring to FIG. 13B, when a voltage of 8 volts is applied to the control gate, and a voltage of 20 volts is applied to the drain region (with the programming time of 10 ms), the erasing threshold voltage window of the memory cell operated through the BBHH is 2.44 volts. On the other hand, when a voltage of 30 volts is applied to the control gate, the erasing threshold voltage window of the memory cell operated through FN is 0.56 volts. It should be noted that compared with the memory cell operated through the FN, the memory cell operated through the BBHH has a higher erasing speed, a larger erasing threshold voltage window, and a lower operation voltage.

In view of the above, the present invention has the following advantages.

1. The pixel structure with an embedded memory cell fabricated according to the present invention can be integrated into the fabrication process of the LTPS LCD panel.

2. The memory cell of the present invention is suitable for the transmissive, reflective, and transflective LTPS LCD panel, without the problem of lower aperture ratio.

3. The number of thin film transistors required in the pixel structure is significantly reduced, thereby further improving the aperture ratio.

4. The pixel structure of the present invention is suitable for displaying static images, and when displaying static images, the power consumption is comparatively lower.

5. As the channel region comprises regularly arranged tips on its surface, not only a lower operation voltage is required for operating the memory and but also the operation speed of the memory device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method of fabricating a memory cell, comprising:
   forming a poly-silicon island on a substrate, wherein the poly-silicon island comprises a source region, a drain region and a channel region located between the source and drain regions, and the channel region comprises a plurality of regularly arranged tips on its surface;
   sequentially forming a first dielectric layer, a trapping layer and a second dielectric layer on the poly-silicon island; and
   forming a control gate on the second dielectric layer.

2. The method of fabricating a memory cell as claimed in claim 1, wherein the step of forming the poly-silicon island comprises:

forming an amorphous silicon layer on the substrate;
  re-crystallizing the amorphous silicon layer into a poly-silicon layer having regularly arranged tips thereon using a sequential laterally solidified low temperature poly-silicon technology;
  patterning the poly-silicon layer; and
  doping the poly-silicon layer to form the source region, the drain region and the channel region.

3. The method of fabricating a memory cell as claimed in claim 1, wherein the step of forming the source region and the drain region comprises implanting N-type dopants into the poly-silicon layer.

4. The method of fabricating a memory cell as claimed in claim 1, further comprising a step of forming a charge induced doped region between the channel region and the drain region, wherein the charge induced doped region is located below the control gate.

5. The method of fabricating a memory cell as claimed in claim 4, wherein the step of forming the charge induced doped region comprises implanting P-type dopants into the poly-silicon layer.

6. The method of fabricating a memory cell as claimed in claim 1, further comprising a step of forming a buffer layer between the substrate and the poly-silicon island.

7. The method of fabricating a memory cell as claimed in claim 1, further comprising:

forming a source contact metal and a drain contacting metal, wherein the source contact metal is electrically connected to the source region, and the drain contact metal is electrically connected to the drain region.

* * * * *